(12) United States Patent
Zebedin

(10) Patent No.: US 8,805,058 B2
(45) Date of Patent: *Aug. 12, 2014

(54) SITE MODELING USING IMAGE DATA FUSION

(71) Applicant: Microsoft Corporation, Redmond, WA (US)

(72) Inventor: Lukas Zebedin, Graz (AT)

(73) Assignee: Microsoft Corporation, Redmond, WA (US)

(*) Notice: Subject to any disclaimer, the term of this patent is extended or adjusted under 35 U.S.C. 154(b) by 0 days.

This patent is subject to a terminal disclaimer.

(21) Appl. No.: 13/625,786

(22) Filed: Sep. 24, 2012

(65) Prior Publication Data

US 2013/0257867 A1    Oct. 3, 2013

Related U.S. Application Data

(63) Continuation of application No. 12/031,713, filed on Feb. 15, 2008, now Pat. No. 8,275,194.

(51) Int. Cl.
*G06K 9/00* (2006.01)

(52) U.S. Cl.
USPC ............ 382/154; 382/173; 382/285; 382/180

(58) Field of Classification Search
None
See application file for complete search history.

(56) References Cited

U.S. PATENT DOCUMENTS

| | | |
|---|---|---|
| 6,744,442 B1 | 6/2004 | Chen et al. |
| 7,133,551 B2 | 11/2006 | Chen et al. |
| 2005/0128212 A1 | 6/2005 | Edecker et al. |
| 2005/0177350 A1 | 8/2005 | Kishikawa |
| 2006/0061566 A1 | 3/2006 | Verma et al. |
| 2006/0238383 A1 | 10/2006 | Kimchi et al. |
| 2007/0242872 A1 | 10/2007 | Rudin et al. |

FOREIGN PATENT DOCUMENTS

WO    2005068936 A1    7/2005

OTHER PUBLICATIONS

Collins et al "The Ascender System: Automatic Modeling from Multiple Aerial Images" Computer Vision and Image Understand vol. 72 No. 2 Nov. 1998.*

(Continued)

*Primary Examiner* — Sean Motsinger
(74) *Attorney, Agent, or Firm* — Steve Spellman; Jim Ross; Micky Minhas

(57) ABSTRACT

Site modeling using image data fusion. Geometric shapes are generated to represent portions of one or more structures based on digital height data and a two-dimensional segmentation of portions of the one or more structures is generated based on three-dimensional line segments and digital height data. A labeled segmentation of the one or more structures is generated based on the geometric shapes and the two-dimensional segmentation. A three-dimensional model of the one or more structures is generated based on the labeled segmentation.

18 Claims, 9 Drawing Sheets

(56) References Cited

OTHER PUBLICATIONS

Baillard et al "Automatic Line Matching and 3D Reconstruction of Buildings from Multiple Views" 1999.*

Mayunga, et al., "Semi-Automatic Building Extraction Utilizing Quickbird Imagery", CMRT05, IAPRS, vol. XXXVI, Vienna, Aug. 2005, pp. 131-136.

Taillandier "Automatic Building Reconstruction from Cadastral Maps and Aerial Images", CMTR05, IAPRT, vol. XXXVI, Vienna, Aug. 2005, pp. 105-110.

Deveau, et al., "Strategy for the Extraction of 3D Architectural Objects from Laser and Image Data Acquired from the Same Viewpoint", pp. 1-5.

Zebedin, et al., "Metropogis: The Next Generation", ACE, vol. 2 2007, pp. 623-634.

You, et al., "Urban Site Modeling From LiDAR", Integrated Media Systems Centre, Computer Science Department, University of Southern California, Los Angeles.

* cited by examiner

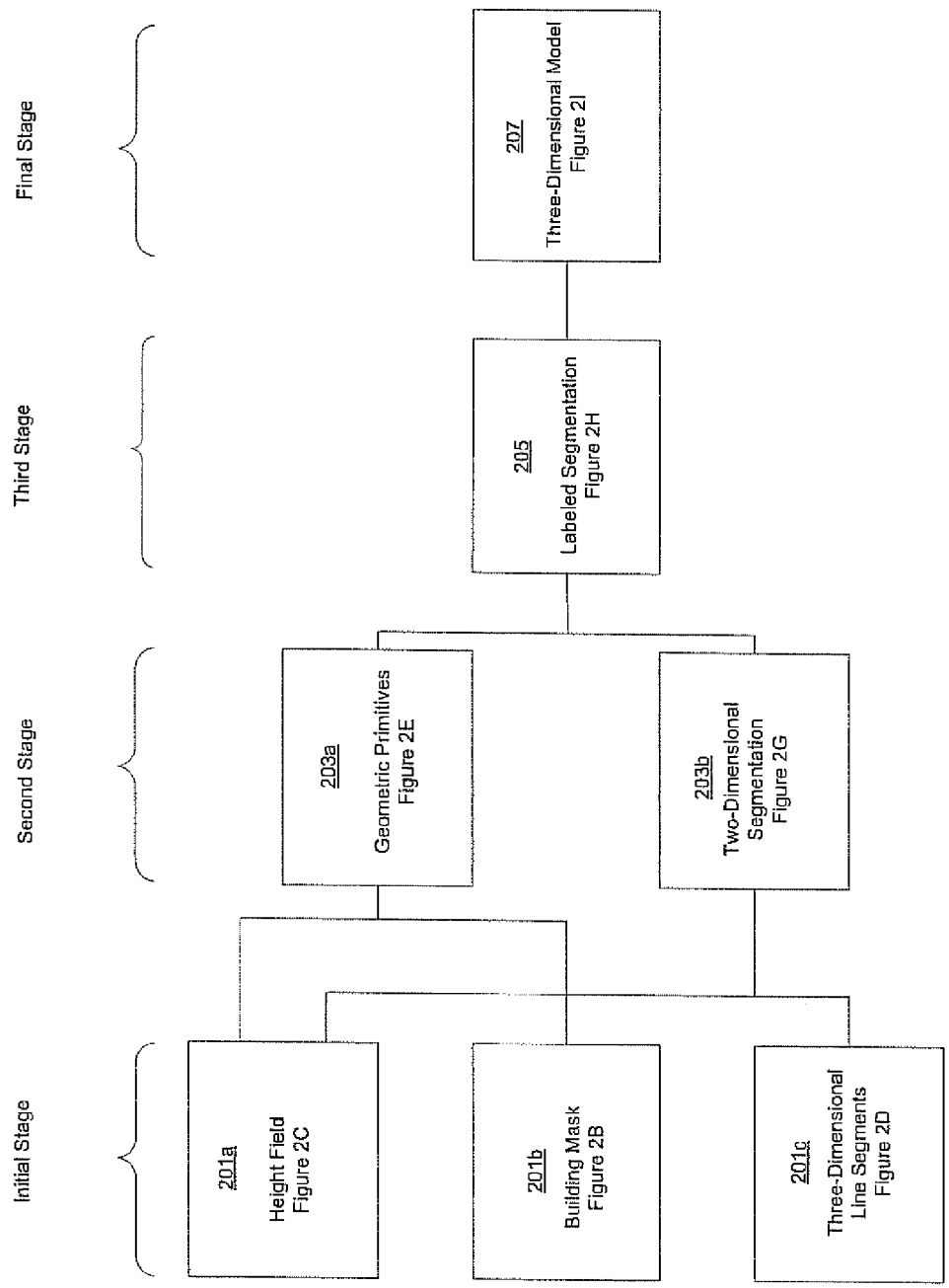

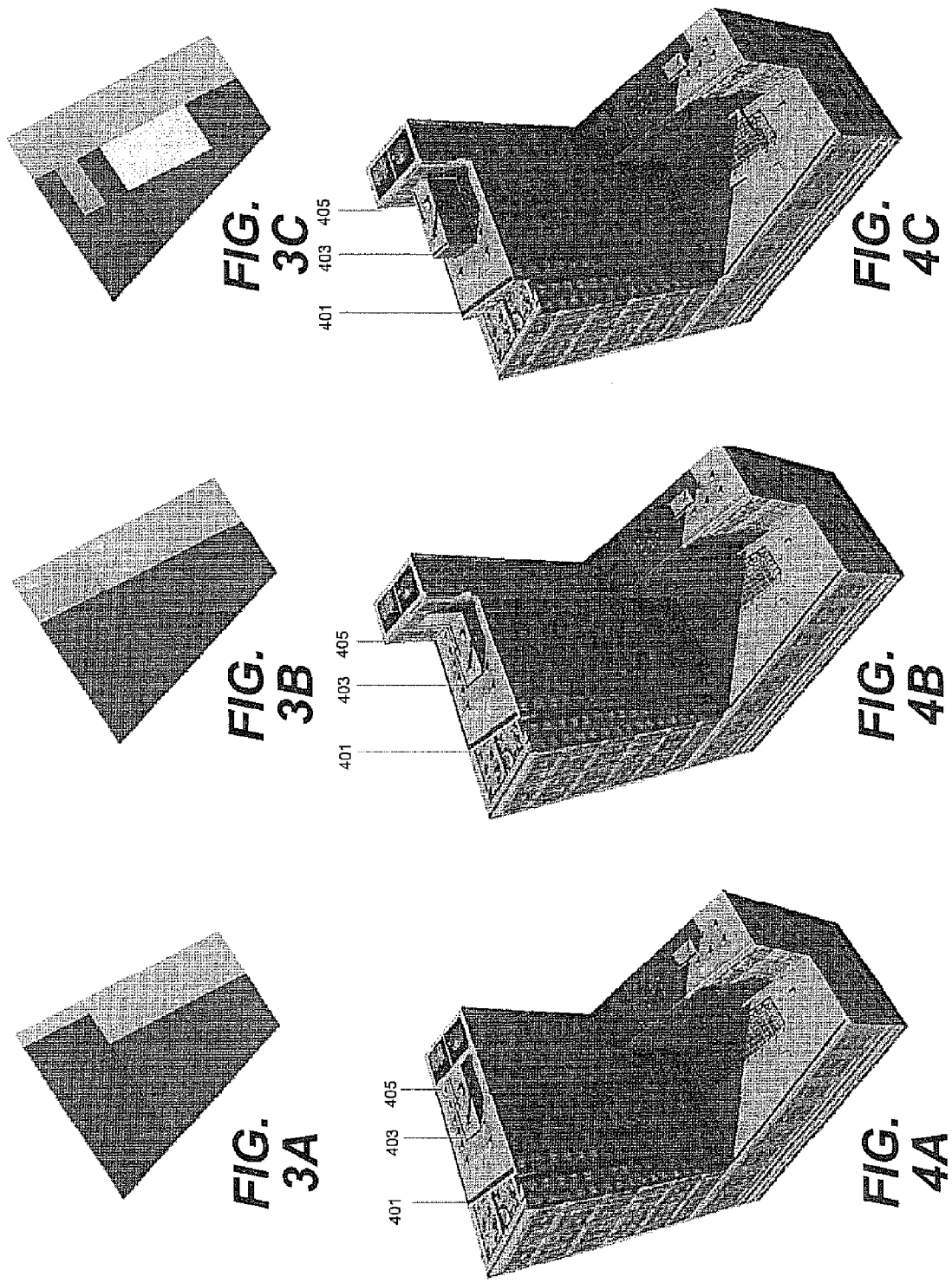

ND USING IMAGE DATA
SITE MODELING USING IMAGE DATA FUSION

CROSS-REFERENCE TO RELATED APPLICATIONS

This application is a continuation of U.S. patent application Ser. No. 12/031,713, filed on Feb. 15, 2008, entitled "Site Modeling Using Image Data Fusion," which is hereby incorporated herein by reference in their entirety.

BACKGROUND

Geospatial information systems (GIS) can generate realistic three-dimensional models of a variety of geographical environments and terrains. These systems can be utilized by system users to access the models and conveniently obtain information concerning particular geographic locations that are of interest to the users. Some conventional geospatial information systems provide users access to models of urban environments whose features have been digitized from aerial images of the environments.

Algorithms for automatically generating realistic three-dimensional models of urban environments have been the subject of research for many years. Historically such models have been used for urban planning purposes or for virtual tourist guides. Since the advent of interactive geospatial system applications the demand for fully automated systems has increased as the costs related to manual processing of large amounts of data that are involved in generating the models are excessive.

A conventional approach to generating realistic three-dimensional models of urban environments includes the use of feature based modeling algorithms which show good results for suburban areas. A drawback of such approaches is their reliance on sparse line features to describe the complete geometry of a building. It has been discovered that existing additional data (cadastral maps and GIS data for example) can help in the reconstruction task. However, external data sources require careful registration and limit the applicability of the algorithms to cities where such information is readily available. Additionally, such a dependency increases costs at large scale deployment.

A different group of algorithms concentrate on the analysis of dense altimetry data obtained from laser scans or dense stereo matching. The extraction of buildings in those point clouds is either performed based on a ground plan or the segmentation of the point clouds into local maxima. Such segmentation approaches which can be based solely on height information, however, are prone to failure if buildings are surrounded by trees and require a constrained model to overcome the smoothness of the data at height discontinuities (where the data should actually reflect discontinuity). Some conventional approaches combine elevation data from a LIDAR (laser radar) scan with satellite imagery using rectilinear line cues. This approach is, however, limited to determining the outline of a building.

In general conventional reconstruction algorithms need either an additional ground plan or restrictive constraints that limit the scope of the method to specific families of buildings (only perpendicular corners or parallel eave lines for example). They also consider only planar approximations which yield poor results for domes and spires. Accordingly, their effectiveness in modeling real world urban environments is limited because their effectiveness in modeling ubiquitous features of such environments such as trees, domes and spires is limited.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Conventional geospatial systems have limited effectiveness in modeling common features of urban environments. A methodology for site modeling that directs modeling of aerially captured images by fusion of image data in a manner that accurately models height discontinuities and roof features of the imaged site and provides image reconstructions of various detail is disclosed. As a part of the site modeling methodology, geometric shapes (e.g., surfaces of revolution, planes, etc.) are generated to represent portions of one or more structures (e.g., buildings) based on digital height data. A two-dimensional segmentation of portions of the one or more structures (e.g., buildings) is generated based on three-dimensional line segments and digital height data. Thereafter, a labeled segmentation (e.g., polygonal segmentation) of the one or more structures (e.g., buildings) is generated based on the geometric shapes and the two-dimensional segmentation. And, a three-dimensional model of the one or more structures (e.g., buildings) is generated based on the labeled segmentation.

BRIEF DESCRIPTION OF THE DRAWINGS

The accompanying drawings, which are incorporated in and form a part of this specification, illustrate embodiments and, together with the description, serve to explain the principles of the embodiments:

FIG. 2A is a functional block diagram of a site modeling process performed by a site modeling component that shows the image data that is input to and output of various stages of the modeling process according to one embodiment.

FIG. 3A shows a top view polygonal segmentation of the building shown in FIG. 4A according to one embodiment.

FIG. 3B shows a top view polygonal segmentation of the building shown in FIG. 4B according to one embodiment.

FIG. 3C shows a top view polygonal segmentation of the building shown in FIG. 4C according to one embodiment.

FIG. 4A shows a model of a building that is based on the polygonal segmentation shown in FIG. 3A according to one embodiment.

FIG. 4B shows a model of a building that is based on the polygonal segmentation shown in FIG. 3B according to one embodiment.

FIG. 4C shows a model of a building that is based on the polygonal segmentation shown in FIG. 3C according to one embodiment.

The drawings referred to in this description should not be understood as being drawn to scale except if specifically noted.

DETAILED DESCRIPTION

Reference will now be made in detail to various embodiments, examples of which are illustrated in the accompanying drawings. While descriptions will be provided in conjunction with these embodiments, it will be understood that the descriptions are not intended to limit the scope of the embodiments. On the contrary, the disclosure is intended to cover alternatives, modifications and equivalents, of these embodiments. Furthermore, in the following description, numerous specific details are set forth in order to provide a thorough understanding of embodiments. In other instances, well-known methods, procedures, components, and circuits have not been described in detail as not to unnecessarily obscure aspects of embodiments.

Figure 1:
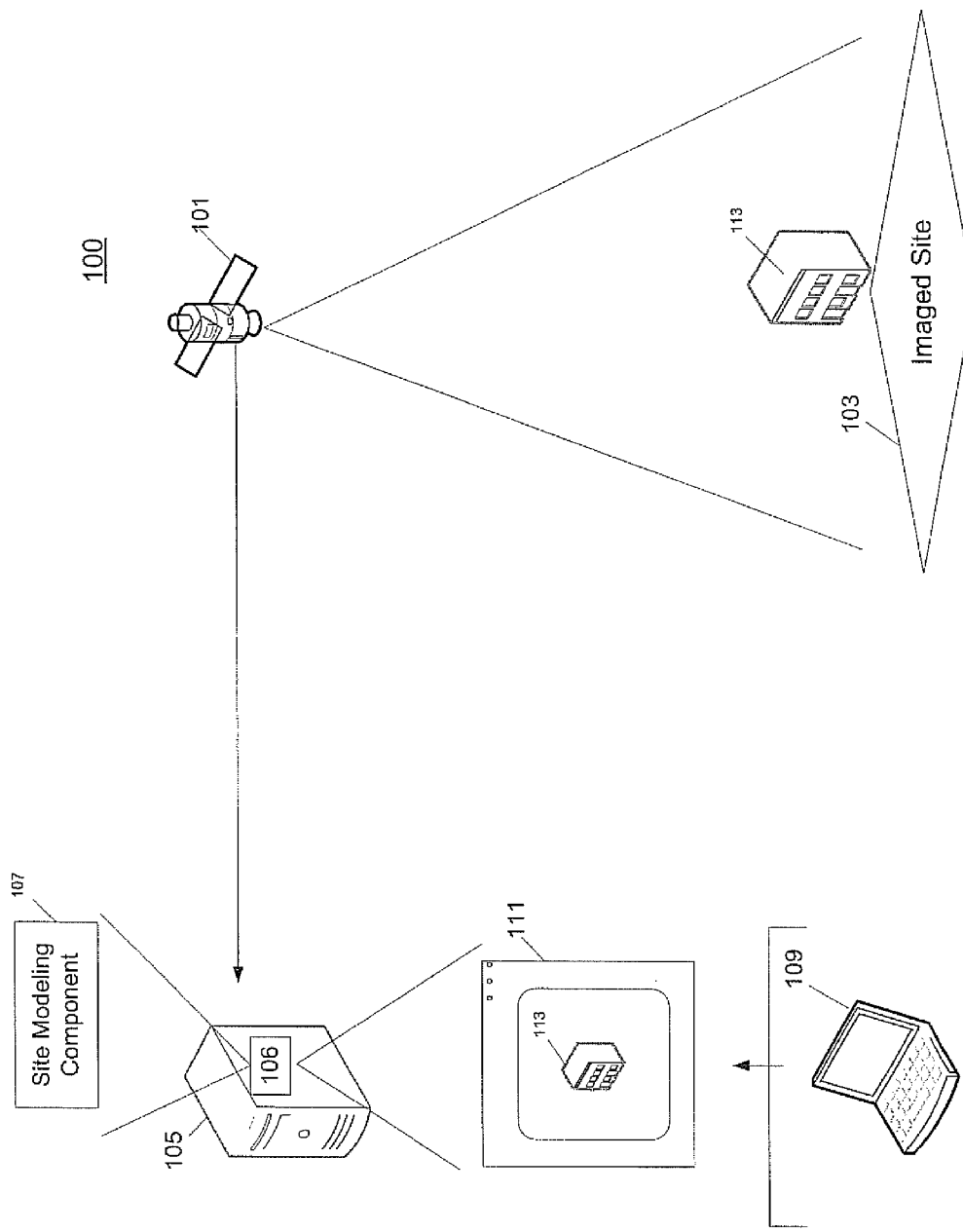
FIG. 1 shows an exemplary operating environment for a site modeling component that uses image data fusion according to one embodiment.

Exemplary Operating Environment of for a Site Modeling Component that uses Image Data Fusion FIG. 1 shows an exemplary operating environment for a site modeling component 107 according to one embodiment. In one embodiment, site modeling component 107 directs the modeling of aerially captured images (images to be modeled or reconstructed) by fusion of image data in a manner that accurately models height discontinuities in the imaged site, accurately models common and uncommon roof designs and provides image reconstructions of various detail. FIG. 1 shows aerial image capture device 101, imaged site 103, server 105, geospatial platform 106, site modeling component 107, interface device 109 and interface 111.

Referring to FIG. 1, aerial image capture device 101 captures aerial images of sites (and structures thereon) that can be modeled by site modeling component 107. Aerial image capture device 101 can be any device (e.g., satellite sensors, aerial cameras etc.) capable of generating aerial images of a target site that can be stored on a server such as server 105 or at another type image storage location that is accessible by users of site modeling component 107. Imaged site 103 is a site that has been imaged by aerial image capture device 101 and whose content is accessible by users of site modeling component 107 for modeling purposes.

Server 105 supports site modeling services for coupled client devices such as interface device 109 (e.g., desktop computer, laptop computer, cellular phone with Internet accessing capability, etc.). In one embodiment, server 105 can include a database which provides storage for aerial images that can be accessed for graphical site modeling purposes. In one embodiment, geospatial platform 106 can reside on server 105. In one embodiment, a user can access geospatial platform 106 via graphic interface 111 from interface device 109.

Geospatial platform 106 enables the browsing of modeled or reconstructed images of imagery taken by image capture device 101 (e.g., satellite sensors, aerial cameras, etc.) such as three-dimensional city models and terrain. In one embodiment, as discussed above, geospatial platform 106 can reside on server 105. In another embodiment, geospatial platform 106 can reside on interface device 109. In yet another embodiment, components of geospatial platform 106 can reside on server 105 and other components of geospatial platform 106 can reside on interface device 109. In one embodiment, geospatial platform 106 can be accessed through graphic interface 111 which can be associated with geospatial platform 106. In one embodiment, using geospatial platform 106 a user can perform a virtual inspection of three-dimensional model of structures that are a part of the imaged site such as building 113.

Site modeling component 107 directs site modeling of aerially captured images (images to be modeled or reconstructed) by fusion of image data in a manner that accurately models height discontinuities in the imaged site, common and uncommon roof designs and provides image reconstructions of various detail. In one embodiment, site modeling component 107 can be a part of geospatial platform 106. In another embodiment, site modeling component 107 can be separate from geospatial platform 106 but can operate cooperatively with geospatial platform 106.

In one embodiment, site modeling component 107 generates three-dimensional graphical models of structures such as buildings based on height data, three-dimensional line segments and a building mask that are related to the particular building that is to be modeled. In one embodiment, geometric primitives that are used to model shapes of the roof of the building are derived from the height data and the building mask. Moreover, a two-dimensional segmentation of the building is derived from the height data and the three-dimensional line segments. A labeled segmentation is derived from the geometric primitives and the two-dimensional segmentation. The three-dimensional model is derived from an extrusion of the two-dimensional segmentation. Site modeling component 107 can provide access to the generated three-dimensional reconstruction of the building to geospatial platform 106 for presentation to requesting users.

It should be appreciated that, in one embodiment, as discussed in detail herein, site modeling component 107 can implement an algorithm for site modeling. In one embodiment, site modeling component 107 can be implemented in software, hardware or in a combination of both.

In operation, a user desiring to view a model (three-dimensional reconstruction) of building 113 can access geospatial platform 106 using device 109. The desired building can be obtained by a search of the database of images contained by server 105 to locate the image of building 113. Once found, the image of building 113 is subjected through operation of site modeling component 107 to modeling or reconstruction processes such as are described in detail herein. The three-dimensional model of building 113 can be retrieved and presented to the user via interface 111 of geospatial platform 106.

Site Modeling Operations

Figure 2D:
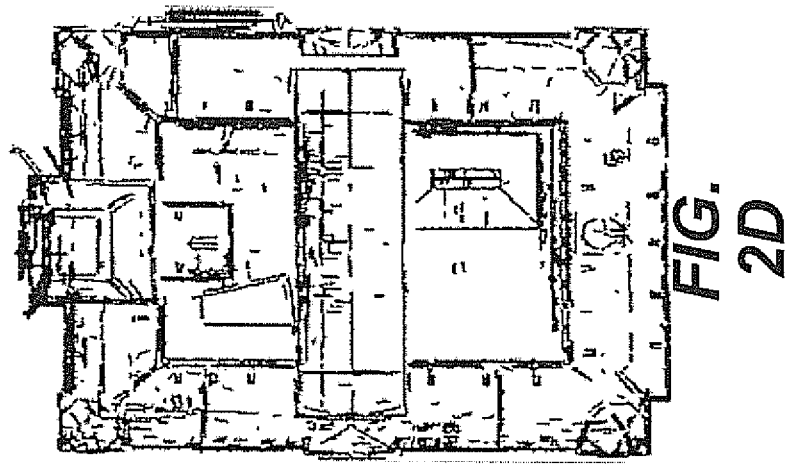
FIG. 2D shows an example of three-dimensional line segments used in a site modeling process according to one embodiment.

FIG. 2A is a functional block diagram of a site modeling (reconstruction) process performed by site modeling component 107 in FIG. 1 that shows the data that is input to and output of the various stages of the process according to one embodiment. FIGS. 2B-2H show actual examples of image data, derived from aerial images of a building to be modeled, that is input to and output of the aforementioned various stages of the site modeling process. FIG. 2A shows an initial stage, second stage, third stage and final stage of the site modeling process. It should be appreciated that the aforementioned stages and their operations including the order in which they are presented are only exemplary. In other embodiments, other stages and operations in other orders can be included.

Figure 2C:
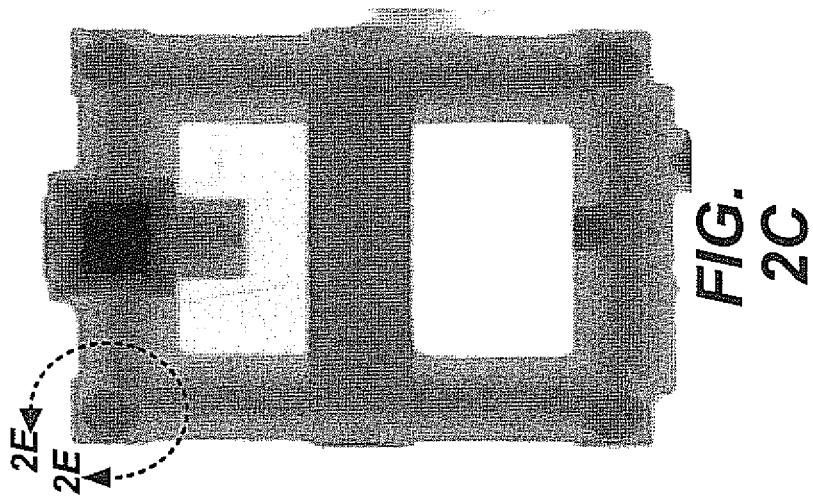
FIG. 2C shows an example of a height field used in a site modeling process according to one embodiment.
Figure 2B:
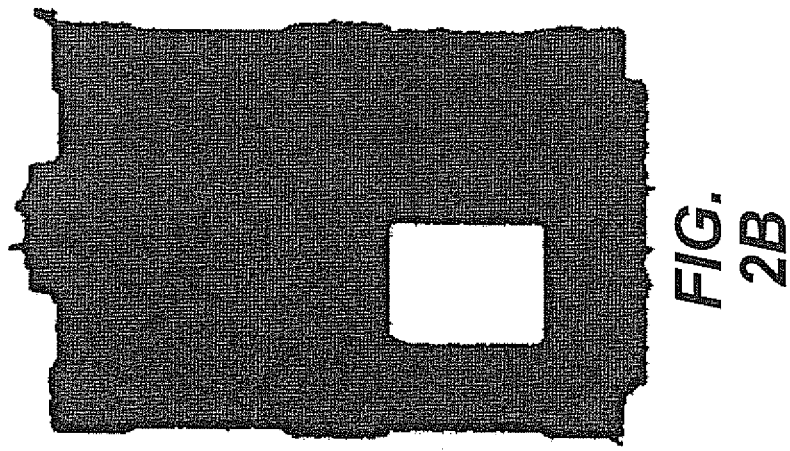
FIG. 2B shows an example of a building mask used in a site modeling process according to one embodiment.

In an initial stage, a height field (digital surface model) 201a, a building mask 201b and three-dimensional line segments 201c that are generated from an imaged site (e.g., 103 in FIG. 1) are accessed and input into an embodiment of the herein described site modeling component (e.g., 107 in FIG. 1) for site modeling. FIGS. 2B, 2C and 2D respectively show examples of the height field (e.g., digital surface model), building mask and three-dimensional line segments that are input into the site modeling component. The portion of the height field encircled and labeled 2E-2E corresponds to a geometric primitive described below with reference to FIG. 2E.

Figure 2E:
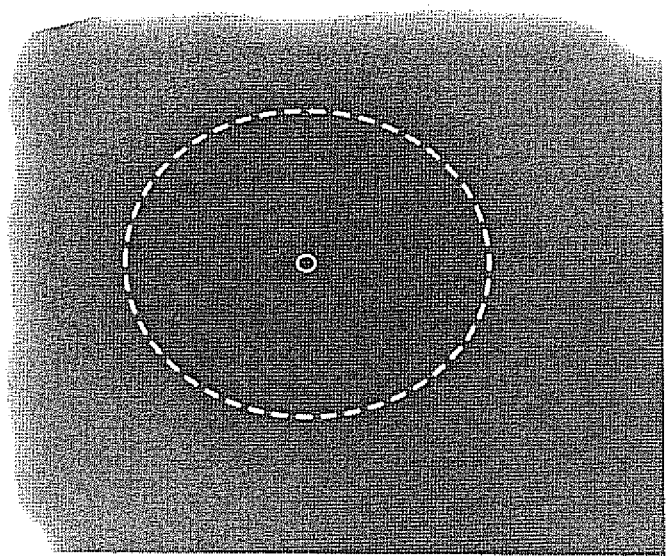
FIG. 2E shows an example of image data that is output from one stage and input into another stage of a site modeling process according to one embodiment.
Figure 2F:
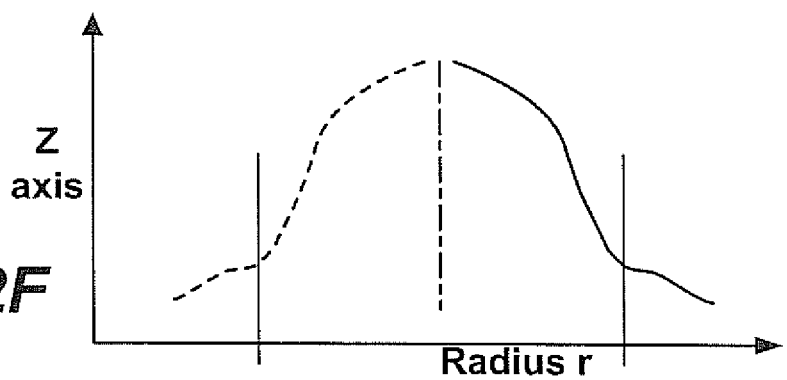
FIG. 2F shows a graph illustrating a height of the roof structure as a function of distance from the center of the roof structure according to one embodiment.
Figure 2G:
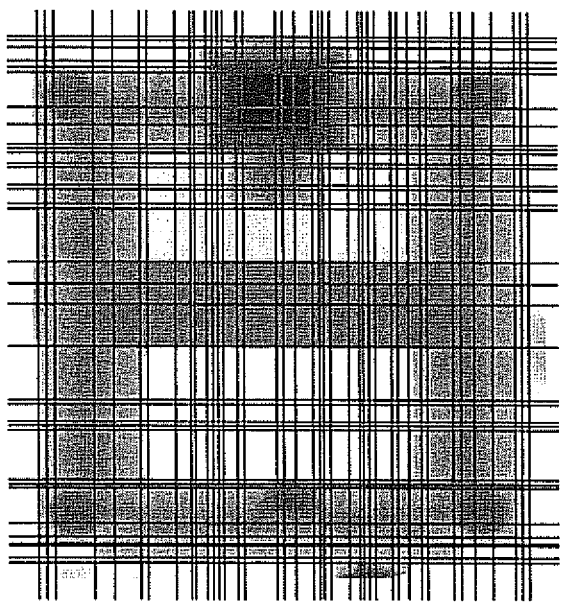
FIG. 2G shows an example of a two-dimensional segmentation used in a site modeling process according to one embodiment.

In the second stage, geometric primitives 203a are generated from the height field 201a and the building mask 201b and a two-dimensional segmentation 203b is generated from the three-dimensional line segments 201c and the height field 201a that are input into the site modeling component (e.g., 107 in FIG. 1) in initial stage 201. FIGS. 2E shows an example of the detection of an axis of a geometric primitive 203a in a raw height field (axis shown encircled at the center of the darkened height field) that is associated with a dome on the roof of the building that is to be modeled. FIGS. 2F shows a graph that illustrates the height of a dome on the roof of the building that is to be modeled (corresponding to the height field of FIG. 2E) as a function of distance from the center of the dome according to one embodiment. The graph delimits a geometric primitive that corresponds to the dome. FIG. 2E shows a two-dimensional segmentation 203b of the building that is to be modeled.

Figure 2I:
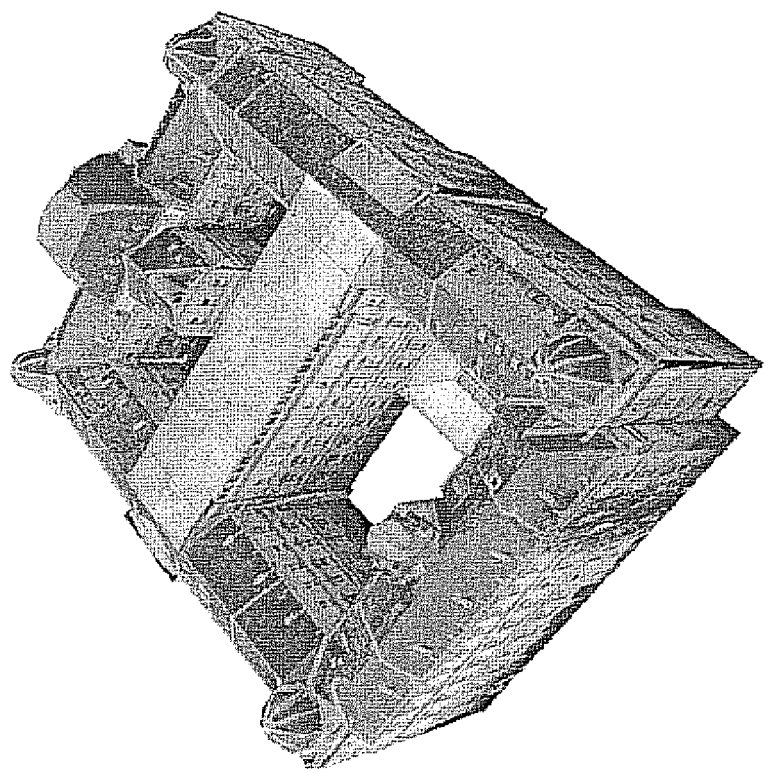
FIG. 2I shows a reconstructed image of a building provided by a site modeling process according to one embodiment.
Figure 2H:
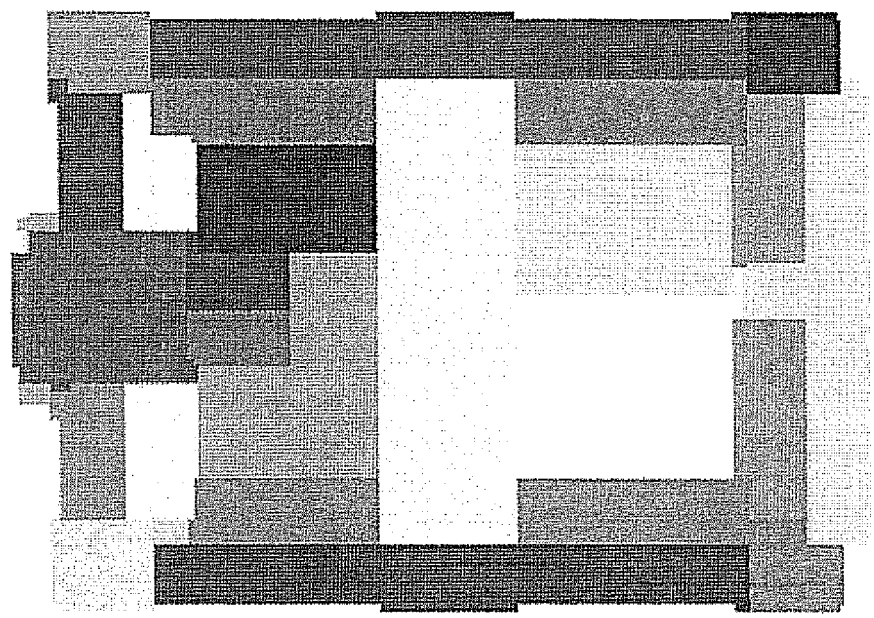
FIG. 2H shows an example of labeled polygons used in a site modeling process according to one embodiment.

In a third stage, a labeled segmentation 205 of the structure is generated from the geometric primitives 203a and the two dimensional segmentation 203b generated in second stage 203. FIG. 2H shows an example of a labeled segmentation such as is generated in the third stage.

In the final stage, the labeled segmentation 205 generated in the third stage 205 is extruded to create a three-dimensional model 207 in the form of a polyhedral reconstruction of the imaged structure. FIG. 2I shows an example of an extruded polyhedral reconstruction of the modeled building generated in accordance with one embodiment.

Details of Exemplary Implementations

In one embodiment, in the modeling process, assumptions may not be made about the shape of roofs. Moreover, facades may be modeled as vertical planes, because the oblique angle of the aerial images taken by an image capture device (e.g., 101 in FIG. 1) may complicate a precise reconstruction of details. In one embodiment, the reconstructed image (as shown above in the example discussed with reference to FIG. 2A) can be represented as a polyhedral model which can be triangulated and textured for easy visual inspection.

In one embodiment, as discussed above, there are three preliminary steps necessary to gather the information which is later used during a global optimization phase. In one embodiment, a dense image matching algorithm can be employed to produce a height field (see FIG. 2C which provides a height value for each point on the ground) which gives an accurate estimate of the elevation. In order to overcome any over-smoothing at height discontinuities, a second step which focuses on such discontinuities can be employed to provide an accurate position and height at these locations involving matching line segments across multiple views (see FIG. 2D) to obtain three-dimensional line segments. Those three-dimensional line segments are used to obtain a two-dimensional segmentation of the building (see FIG. 2G). It should be appreciated that basic geometric shapes can be detected in the point cloud described by the height field which can be used as basic building blocks to describe the roof shape (see FIG. 2E).

In one embodiment, the polyhedral representation of the roof shape can be determined by a global optimization process that uses an algorithm such as, for example, a standard Graph Cuts energy minimization algorithm which assigns each polygon that is generated by the aforementioned segmentation (FIG. 2G), to a geometric primitive (see FIG. 2H). In other embodiments other optimization algorithms can be used as well to assign polygons.

Geometric Primitives

In one embodiment, geometric primitives are the basic building blocks that are used to describe the shape of building roofs. Two of the basic types of geometric primitives that can be used in the modeling processes described herein to describe building roofs include planes and surfaces of revolution (see polygons of FIG. 2H). However, in one embodiment, the modeling processes described herein are not restricted to those geometric primitives and can be easily extended to support other geometric forms.

In one embodiment, site modeling component 107 operations used to detect geometric primitives in building roofs are independent of operations used to compose the building model. To overcome arbitrary hypotheses that may be collected and fed into later stages of the algorithm, the global optimization algorithm (discussed above) determines the optimal representation for the roof shape. Moreover, the geometric primitives used can be extended, in order to exploit symmetries present in, for example, gabled roofs.

In one embodiment, the herein described site modeling site modeling component (e.g., 107 in FIG. 1) can use standard algorithms for efficiently detecting planes in point clouds (FIG. 2C) for urban reconstruction operations. However, planar approximations of certain roof shapes such as domes and spires, that may be obtained from those algorithms can be cumbersome and may not take into account the redundancy provided by the symmetrical shape. Consequently, exemplary embodiments are provided with the capacity to approximate roof shapes such as domes and spires (FIGS. 2E and 2F) and to combine them seamlessly to obtain a realistic model of the building.

In one embodiment, the herein described site modeling component (e.g., 107 in FIG. 1) accomplishes such by incorporating an algorithm that robustly detects surfaces of revolution, which are natural descriptors of domes and spires. Moreover, in one embodiment, the algorithm embodied in the site modeling component (e.g., 107 in FIG. 1) can employ instantaneous kinematics to describe a surface by a Euclidean motion of a curve in three dimensions.

Information Fusion

Exemplary embodiments merge or fuse different types of image information to produce accurate reconstructions. In one embodiment, as discussed above, three-dimensional line segments (FIG. 2D) and dense height field data (Figure B) are used to generate reconstructions that accurately reflect height discontinuities in the reconstructed structures. In one embodiment, this is accomplished, as discussed above, by using matched three-dimensional line segments to obtain a segmentation of the building into polygons (FIG. 2G) that are then labeled and assigned to one of the geometric primitives discussed in the previous section (FIG. 2H). In this manner a piecewise planar reconstruction (surfaces of rotation are approximated by a rotating polyline and therefore also yield piecewise planar surfaces in the polyhedral model) of the building roof shape is obtained where the matched feature lines allow a precise localization of height discontinuities.

It should be appreciated that obtained three-dimensional line segments can contain false matches. Moreover, many short line segments can be merged to obtain longer and more robust line estimations. In one embodiment, both of these aspects of planar reconstruction are considered in projecting the three dimensional lines into the height field and by creating a weighted orientation histogram. The principal orientations are easily detected by finding local maxima in this histogram. Along the directions of the principal orientations detected using the histogram, quasi-parallel lines can be grouped and merged to refine the position of the lines.

In one embodiment, the algorithm embodied in the site modeling component (e.g., 107 in FIG. 1) described herein extends each of the grouped lines (see lines in Figure G) to fully span the building that is being reconstructed in order to simplify the segmentation process. Initially, the algorithm is initialized with a rectangle that spans the entire building. All lines are then iteratively used to divide the rectangle into more convex polygons (see FIG. 2H). In this process each convex polygon is decomposed into at most two new convex polygons by a line derived from the three-dimensional line segments. Accordingly, the polygonal underpinning of the reconstruction is derived from a fusion of three-dimensional data and the dense height data discussed in detail herein.

FIGS. 3A-3C and FIGS. 4A-4C illustrate this concept with an actual building located in Graz, Austria. FIGS. 3A-3C show a series of top view polygonal segmentations corresponding to the buildings in FIGS. 4A-4C respectively. Referring to FIGS. 3A-3C, it is important to note that the polygon density of the segmentation shown in FIG. 3C is higher than the polygon density of the segmentation shown in FIG. 3B which is higher than the polygon density of the segmentation shown in FIG. 3A. Accordingly, the reconstruction in FIG. 4C shows more detail than the reconstruction shown in 4B which shows more detail than the reconstruction shown in FIG. 4A.

Referring to FIGS. 4A-4C, height discontinuities are shown at 401, 403 and 405. In the FIG. 4A reconstruction the height discontinuities are less visible (e.g., due to more smoothing at the discontinuities) than in the height discontinuities in the reconstruction of FIG. 4B, which are less visible than the height discontinuities in the reconstruction of FIG. 4A. Conventional reconstruction methodologies are susceptible to over-smoothing and do not provide the level of fidelity of the reconstructed image to that of the original image that the information fusion methodologies that are embodied in the embodiments described herein provide as illustrated in FIG. 4A.

It should be appreciated that FIGS. 3A-3C and 4A-4C illustrate the effect of a smoothness term that is a part of the global optimization energy function of an algorithm used by the site modeling component (e.g., 107 in FIG. 1) described herein. FIGS. 3A-3C and 4A-4C show the results of respective reconstructions of the same building using respective values of the smoothness term. As is shown in FIGS. 3A-3C, the reconstructions require a reduced triangle count as the geometry of the reconstruction is progressively simplified. In one embodiment, control over this triangle count (such as by means of the graph cuts algorithm) enables users of site modeling component 107 to find a globally optimal tradeoff between data fidelity (FIG. 4A) and generalization (FIGS. 4B and 4C).

Figure 5:
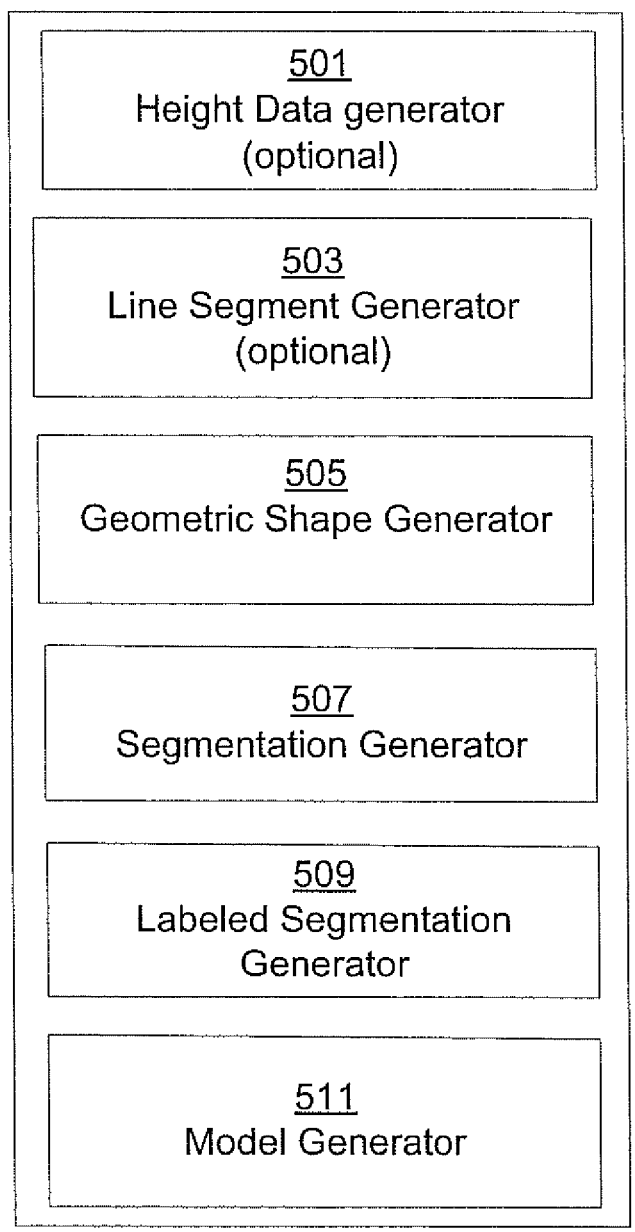
FIG. 5 shows components of a site modeling component that uses image data fusion according to one embodiment.

Components of Site Modeling Component that uses Image Data Fusion According to Embodiments FIG. 5 shows sub-components of a site modeling component 107 that uses image data fusion according to one embodiment. In one embodiment, site modeling component 107 can implement an algorithm for graphical site modeling. In the FIG. 3 embodiment, site modeling component 107 includes height data generator 501 (optional), line segment generator 503 (optional), geometric shape generator 505, segmentation generator 507, labeled segmentation generator 509 and model generator 511.

It should be appreciated that aforementioned components of site modeling component 107 can be implemented in hardware or software or in a combination of both. In one embodiment, components and operations of site modeling component 107 can be encompassed by components and operations of one or more computer programs (e.g., system 106 in FIG. 1). In another embodiment, components and operations of site modeling component 107 can be separate from the aforementioned one or more computer programs but can operate cooperatively with components and operations thereof.

Referring to FIG. 5, height data generator 501 (optional) generates digital height data (e.g., height field, see example of height field at FIG. 2C) that corresponds to individual points of one or more structures (e.g., buildings) that are imaged as a part of an aerial imaging of a site. In one embodiment, inputs to height data generator 501 can include aerial images provided from devices such as laser scanners, satellites, cameras, etc.

Line segment generator 503 (optional) generates three-dimensional line segments (see example of three-dimensional line segments in FIG. 2D) of one or more imaged structures. In one embodiment, the three-dimensional line segments are generated by matching line segments across multiple views. In one embodiment, the three-dimensional line segments are matched from observations in at least four images.

As indicated above, height data generator and line segment generator 501 are optional. In one embodiment, the data generated by height data generator 501 and line segment generator 503 can be generated by external systems. In such embodiments, the data that is generated by height data generator 501 and line segment generator 503 can be supplied by the external system as inputs to site modeling component 107.

Geometric shape generator 505 generates geometric shapes to represent the various portions of the roofs of the one or more structures. In one embodiment, the geometric shapes are generated based on: (1) a building mask and (2) digital height field inputs to geometric shape generator 305. In one embodiment, the geometric shapes are generated based on a detection of geometric primitives (geometric shapes) in the digital height data.

Segmentation generator 507 generates a two-dimensional segmentation (see example of a two-dimensional segmentation in FIG. 2G) of the aforementioned one or more structures. In one embodiment, the two-dimensional segmentation is based on: (1) three-dimensional line segments and (2) digital height data, inputs to the segmentation generator.

Labeled segmentation generator 509 generates a labeled segmentation (see example of labeled segmentation in FIG. 2H) of the aforementioned one or more structures. In one embodiment, the labeled segmentation is generated based on: (1) detected geometric shapes and (2) a two-dimensional segmentation, inputs to labeled segmentation generator 509. In one embodiment, the labeled segmentation results in a segmentation of the one or more structures into polygons. In one embodiment, after the one or more structures are segmented into polygons, each of the polygons is labeled and assigned to one of the geometric shapes.

Model generator 511 generates a three-dimensional model (see example of three-dimensional model in FIG. 2I) of one or more structures based on the labeled segmentation provided by labeled segmentation generator 509. In one embodiment, the three-dimensional model is generated by extruding the labeled segmentation to produce a three-dimensional polyhedral model of the one or more structures.

Figure 6:
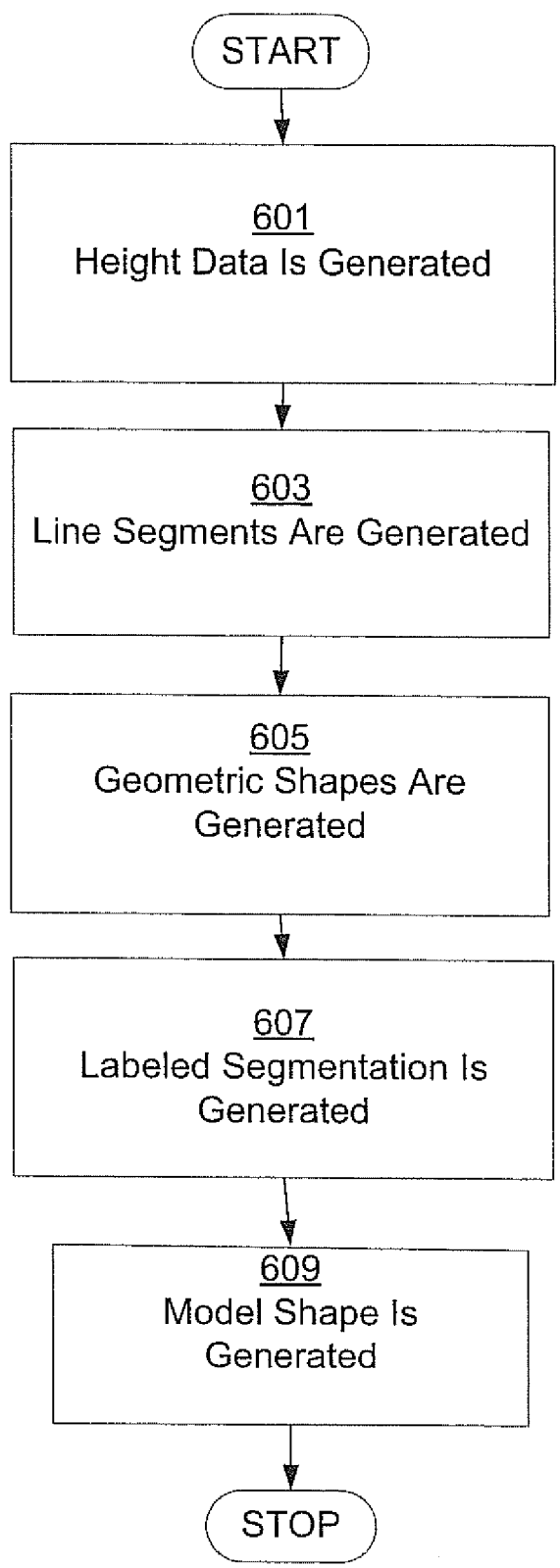
FIG. 6 shows a flowchart of the steps performed in a method for urban site modeling using image data fusion according to one embodiment.

Exemplary Operations of Site Modeling Component that Uses Image Data Fusion According to Embodiments FIG. 6 shows a flowchart 600 of the steps performed in a method for site modeling using image data fusion according to one embodiment. The flowchart includes processes that, in one embodiment, can be carried out by processors and electrical components under the control of computer-readable and computer-executable instructions. Although specific steps are disclosed in the flowcharts, such steps are exemplary. Moreover, embodiments are well suited to performing various other steps or variations of the steps recited in the flowcharts. Within various embodiments, it should be appreciated that the steps of the flowcharts can be performed by software, by hardware or by a combination of both.

Referring to FIG. 6, at step 601 a height field for one or more structures (e.g., buildings etc.) is generated. In one embodiment, the height field can be generated by a height data generator (e.g., 501 in FIG. 5).

At step 603, a three-dimensional line segments for the one or more structures are generated. In one embodiment, the three-dimensional line segments can be generated by a line segment generator (e.g., 503 in FIG. 5).

At step 605, geometric primitives (geometric shapes) corresponding to the one or more structures are generated. In one embodiment, the geometric shapes can be generated by a geometric shape generator (e.g., 505 in FIG. 5).

At step 607, a two-dimensional segmentation is generated. In one embodiment, the two-dimensional segmentation can be generated by a segmentation generator (e.g., 507 in FIG. 5).

At step 609, a labeled segmentation is generated. In one embodiment, the labeled segmentation can be generated by a labeled segmentation generator (e.g., 509 in FIG. 5).

At step 611, a model is generated. In one embodiment, the model can be generated by a model generator (e.g., 511 in FIG. 5). In one embodiment, the model is generated by extruding the labeled segmentation to produce a three-dimensional polyhedral model of the one or more structures.

Figure 7:
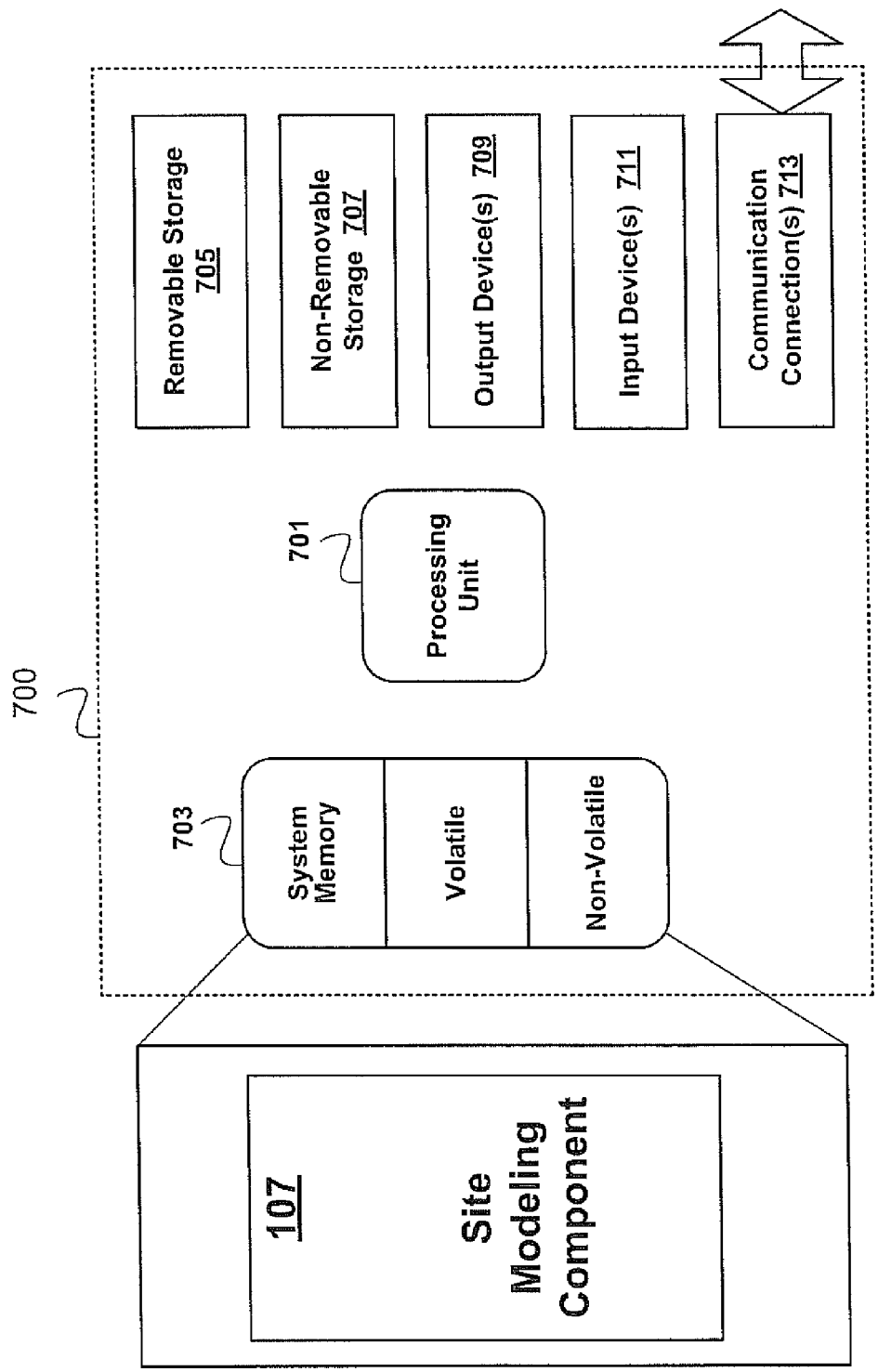
FIG. 7 shows an exemplary computing device environment of site modeling component that uses image data fusion according to one embodiment.

Exemplary Hardware Operating Environment of Site Modeling Component that uses Image Data Fusion According to One Embodiment FIG. 7 shows an exemplary computing device 700 according to one embodiment. Referring to FIG. 7, computing device 700 can be included as a part of a server (e.g., server 105 in FIG. 1) and/or an interface device (interface device 109 in FIG. 1) in accordance with one embodiment. Computing device 700 typically includes at least some form of computer readable media. Computer readable media can be any available media that can be accessed by computing device 700 and can include but is not limited to computer storage media.

In its most basic configuration, computing device 700 typically includes processing unit 701 and system memory 703. Depending on the exact configuration and type of computing device 700 that is used, system memory 703 can include volatile (such as RAM) and non-volatile (such as ROM, flash memory, etc.) elements or some combination of the two. In one embodiment, as shown in FIG. 7, a site modeling component 107 (see description of site modeling component 107 made with reference to FIG. 1) that uses the fusion of image data to model sites can reside in system memory 703.

Additionally, computing device 700, especially the version that can be a part of server 105 in FIG. 1, can include mass storage systems (removable 705 and/or non-removable 707) such as magnetic or optical disks or tape. Similarly, computing device 700 can include input devices 709 and/or output devices 711 (e.g., such as a display). Additionally, computing device 700 can include network connections 713 to other devices, computers, networks, servers, etc. using either wired or wireless media. As all of these devices are well known in the art, they need not be discussed in detail.

With reference to exemplary embodiments thereof, site modeling using image data fusion is disclosed. As a part of the site modeling, geometric shapes are generated to represent portions of one or more structures based on digital height data and a two-dimensional segmentation of portions of the one or more structures is generated based on three-dimensional line segments and digital height data. A labeled segmentation of the one or more structures is generated based on the geometric shapes and the two-dimensional segmentation. A three-dimensional model of the one or more structures is generated based on the labeled segmentation.

Exemplary embodiments do not need any manual intervention and uses only data derived from the original aerial imagery. It combines dense height data together with feature matching to overcome the problem of precise localization of height discontinuities. In one embodiment, buildings are modeled by unconstrained polyhedras. In one embodiment, a novel application of surfaces of revolution allows the elegant description of a much broader family of roof shapes.

The foregoing descriptions of specific embodiments have been presented for purposes of illustration and description. They are not intended to be exhaustive or to limit the subject matter to the precise forms disclosed, and obviously many modifications and variations are possible in light of the above teaching. The embodiments were chosen and described in order to best explain the principles of the disclosed subject matter and its practical application, to thereby enable others skilled in the art to best utilize the disclosed subject matter and various embodiments with various modifications as are suited to the particular use contemplated. It is intended that the scope of the disclosed subject matter be defined by the Claims appended hereto and their equivalents.

What is claimed is:

1. A method of site modeling using image data, comprising:

generating a labeled segmentation of one or more structures based on geometric shapes and a two-dimensional segmentation that is based on three dimensional line segments that are generated by matching line segments across multiple views; and generating a three-dimensional model of said one or more structures based on said labeled segmentation.

2. The method of claim 1, wherein said generating a three-dimensional model comprises generating a model of said one or more structures at various levels of detail.

3. The method of claim 1, wherein a generation of said geometric shapes comprises detecting basic geometric shapes in a point cloud.

4. The method of claim 1, wherein a generation of said two dimensional segmentation comprises segmenting a building using three-dimensional line segments.

5. The method of claim 1, wherein said generating said labeled segmentation comprises the use of basic geometric shapes and a two-dimensional segmentation.

6. The method of claim 1, wherein said generating a three-dimensional model comprises extruding a labeled segmentation to produce a three dimensional polyhedral representation of said one or more structures.

7. A method of urban site modeling using image data fusion, comprising:
- accessing digital height data corresponding to individual points of one or more buildings that are a part an aerial image of a site;
- generating a labeled segmentation of said one or more buildings based on geometric shapes and a two-dimensional segmentation, wherein said geometric shapes are by a process that includes detecting basic geometric shapes in a point cloud; and
- generating a three-dimensional model of said one or more buildings based on said labeled segmentation.

8. The method of claim 7, wherein said generating digital height data comprises taking aerial photographs of a site.

9. The method of claim 7, wherein said two dimensional segmentation is based on a generation of three dimensional line segments that comprises matching line segments across multiple views.

10. The method of claim 7, wherein said two dimensional segmentation is generated by segmenting a building using three-dimensional line segments.

11. The method of claim 7, wherein said generating said labeled segmentation comprises using basic geometric shapes and a two-dimensional segmentation.

12. The method of claim 7, wherein said generating a three-dimensional model comprises extruding a labeled segmentation to produce a three dimensional polyhedral representation of said one or more buildings.

13. A computer readable storage device having computer-executable components, comprising:
- a labeled segmentation generating component for generating a labeled segmentation of one or more structures based on geometric shapes and a two-dimensional segmentation that is generated by segmenting a building using three-dimensional line segments; and
- a three dimensional model generating component for generating a three-dimensional model of said one or more structures based on said labeled segmentation.

14. The computer readable storage device of claim 13, wherein said three-dimensional model generating component generates a three-dimensional model of said one or more structures at various levels of detail.

15. The computer readable storage device of claim 13, wherein a generation of said geometric shapes comprises detecting basic geometric shapes in a point cloud.

16. The computer readable storage device of claim 13, wherein said labeled segmentation generating component generates said labeled segmentation by assigning polygons to said one or more portions of said one or more structures.

17. The computer readable storage device of claim 13, wherein said three-dimensional model generating component extrudes a labeled segmentation to produce a three dimensional polyhedral representation of said one or more structures.

18. A computer-readable storage device encoded with processing instructions that, when executed, cause one or more processors to perform the method of urban site modeling using image data fusion of claim 7.

* * * * *